United States Patent [19]

Ackerman

[11] Patent Number: 5,042,488

[45] Date of Patent: Aug. 27, 1991

[54] METHODS EMPLOYING DEUTERIUM FOR OBTAINING DIRECT, OBSERVABLE DEUTERIUM MAGNETIC RESONANCE IMAGES IN VIVO AND IN SITU

[75] Inventor: Joseph J. H. Ackerman, University City, Mo.

[73] Assignee: The Washington University, St. Louis, Mo.

[21] Appl. No.: 391,939

[22] Filed: Aug. 7, 1989

Related U.S. Application Data

[63] Continuation of Ser. No. 102,544, Sep. 29, 1987, abandoned, which is a continuation of Ser. No. 824,203, Jan. 30, 1986, abandoned.

[51] Int. Cl.[5] .............................................. A61B 6/00
[52] U.S. Cl. ........................................ 128/654; 424/9
[58] Field of Search .................. 600/12; 128/654, 653; 424/9

[56] References Cited

U.S. PATENT DOCUMENTS

| 4,254,778 | 3/1981 | Clow et al. | 128/653 |
| 4,363,793 | 12/1982 | Blau et al. | 424/1 |
| 4,447,600 | 5/1984 | Ogura et al. | 536/23 |
| 4,586,511 | 5/1986 | Clark | 128/653 |
| 4,663,443 | 5/1987 | Shibayama et al. | 536/4.1 |
| 4,716,225 | 12/1987 | Ledley et al. | 536/122 |
| 4,775,522 | 10/1987 | Clark | 424/9 |
| 4,889,125 | 6/1987 | Doddrell et al. | 128/653 |
| 4,889,126 | 6/1987 | Doddrell et al. | 128/653 |
| 4,893,627 | 1/1990 | Kehayias et al. | 128/654 |

OTHER PUBLICATIONS

John Waugh, Advances in Magnetic Resonance, (1982), 233–234.

Primary Examiner—C. Fred Rosenbaum
Assistant Examiner—Mark O. Polutta
Attorney, Agent, or Firm—Senniger, Powers, Leavitt & Roedel

[57] ABSTRACT

A method for in vivo and in situ NMR imaging of body organs or tissues employing direct, observable deuterium magnetic resonance images.

6 Claims, 4 Drawing Sheets

PPM

5,042,488

METHODS EMPLOYING DEUTERIUM FOR OBTAINING DIRECT, OBSERVABLE DEUTERIUM MAGNETIC RESONANCE IMAGES IN VIVO AND IN SITU

CROSS-REFERENCE TO RELATED APPLICATIONS

This application is a continuation of application Ser. No. 102,544, filed Sept. 29, 1987 and now abandoned which was a continuation of application Ser. No. 824,203, filed Jan. 30, 1986 and now abandoned.

BACKGROUND OF THE INVENTION

This invention relates to magnetic resonance imaging (MRI) and magnetic resonance spectroscopy (MRS), also referred to as nuclear magnetic resonance (NMR) imaging and NMR chemical shift spectroscopy, and more particularly, to methods and compositions for enhancing magnetic resonance images and spectra of body organs and tissues.

The recently developed techniques of NMR imaging encompasses the detection of certain atomic nuclei utilizing magnetic fields and radio-frequency radiation and is based on the earlier development of NMR spectroscopy. It is similar in some respects to x-ray computed tomography (CT) in providing a cross-sectional display of the body organ anatomy with excellent resolution of soft tissue detail. In current use, the images produced constitute a map of the distribution density of protons and/or their relaxation times in organs and tissues. The MRI technique is advantageously non-invasive as it avoids the use of ionizing radiation.

While the phenomenon of NMR was demonstrated in 1945, it is only relatively recently that it has found application as a means of spatially imaging the internal structure of the body, as a result of the original suggestion of Lauterbur [Nature, 242, 190, (1973)], and chemically mapping the metabolic status of the body, as a result of the original suggestion of Ackerman et al. [Nature, 283, 167 (1980)]. The lack of any known hazard associated with the level of the magnetic and radio-frequency fields that are employed renders it possible to make repeated scans on vulnerable individuals. Additionally, any scan plane can readily be selected including transverse, coronal, and sagittal sections.

In an NMR experiment, the nuclei under study in a sample (e.g., protons) are irradiated with the appropriate radio-frequency (RF) energy in a highly uniform magnetic field. These nuclei, as they relax, subsequently emit RF radiation at a sharp resonance frequency. The emitted RF energy of the nuclei depends on the applied magnetic field and on the magnetogyric ratio of the specific nuclide under observation.

According to known principles, when nuclei with appropriate non-zero spin are placed in an applied static magnetic field [$B_o$, expressed generally in units of tesla ($10^4$ gauss)] they align along the direction of the static field axis, usually taken to be the z axis. In the case of protons, these nuclei precess at a frequency of 42.6 MHz ($42.6 \times 10^6$ Hz or cycles per second) at a field strength of 1 tesla. In this polarized or aligned state, an RF pulse of radiation will excite the nuclei and can be considered to tip or rotate the nuclei out of alignment with the field axis, the extent of this rotation being determined by the pulse duration and amplitude. After the RF pulse, the nuclei "relax" or return to the thermal equilibrium alignment in the static magnetic field, emitting radiation at the resonance frequency. The decay of the NMR signal is characterized by two relaxation times. These are $T_1$, the spin-lattice relaxation time (or longitudinal relaxation time), that is, the exponential time constant governing the return to thermal equilibrium along the direction of the externally applied static magnetic field, and $T_2$, the spin-spin relaxation time (or transverse relaxation time) associated with the dephasing of the initially coherent precession of individual proton spins. These relaxation times have been established in the case of proton NMR for various fluids, organs and tissues in different species of mammals.

In MRI, scanning planes and slice thickness can be selected without loss of resolution. This permits high quality transverse, coronal and sagittal images to be obtained directly. The absence of any moving parts in MRI equipment promotes a high reliability. It is believed that MRI has a greater potential than CT for the selective examination of tissue characteristics in view of the fact that in CT, x-ray attenuation coefficients alone determine image contrast whereas at least four separate variables ($T_1$, $T_2$, nuclear spin density and flow) may contribute to the NMR signal. For example, it has been suggested [Damadian, Science, 171, 1151, (1971)] that the values of the $T_1$ and $T_2$ relaxation in tissues are generally longer by about a factor of 2 in excised specimens of neoplastic tissue compared with the host tissue.

By reason of its sensitivity to subtle physio-chemical differences between organs and/or tissues, it is believed that MRI may be capable of differentiating tissue types and in detecting diseases which induce physio-chemical changes that may not be detected by x-ray or CT which are only sensitive to differences in the electron density of tissue. The images obtainable by MRI techniques can in some instances also enable the physician to detect structures smaller than those detectable by CT and thereby provide comparable or better spatial resolution.

Proton or $^1H$ magnetic resonance imaging has been extensively developed for various applications. Other nuclides such as $^{23}Na$, $^{19}F$ and $^{31}P$ have also been employed for imaging utilizing MRI techniques. For example, fluorine atoms ($^{19}F$) give a nuclear magnetic resonance signal and, thus, may function as suitable "probes"0 in MRI when combined in a chemically suitable form. There remains a continuing need for further improvements in MRI techniques and methodology.

SUMMARY OF THE INVENTION

Among the several objects of the invention may be noted the provision of novel methods for obtaining direct observable deuterium magnetic resonance images of body organs and tissues in vivo and in situ; and the provision of such methods in which deuterium labeled water ($D_2O$ or HOD) or other deuterium labeled compound us administered to a mammal and magnetic resonance imaging or spectroscopic techniques are utilized to obtain deuterium magnetic resonance images of selected body organs and/or tissues. Other objects and features, including the use of such agents to measure blood flow and for deuterium chemical shift NMR spectroscopic examination of tissue, will be in part apparent and in part pointed out hereinafter.

Briefly, therefore, the invention is directed to a method for obtaining direct observable deuterium magnetic resonance images of body organs and/or tissues in vivo and in situ by administering deuterium to a mammal in a sufficient amount to provide deuterium magnetic resonance images and utilizing magnetic resonance imaging techniques to obtain direct, observable deuterium magnetic resonance images or selected body organs and/or tissues of the mammal in vivo and in situ.

DESCRIPTION OF THE PREFERRED EMBODIMENTS

Figure 1A:
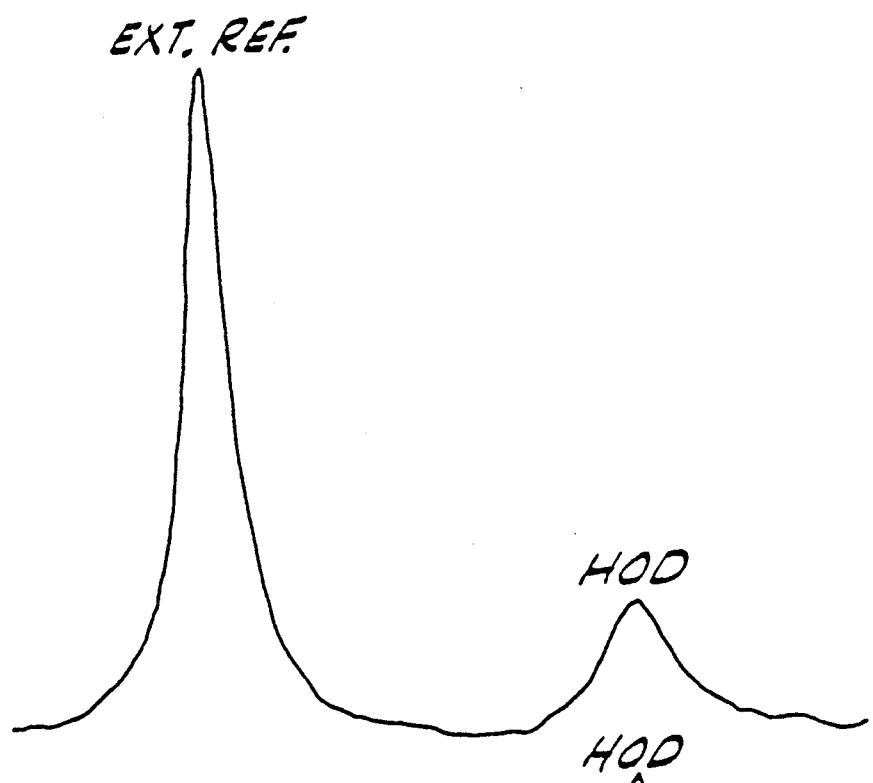
FIG. 1 shows representative deuterium spectra from rat liver in vivo at 55.28 MHz. a) Natural abundance deuterium spectrum consisting of 160 free induction decays accumulated and summed over 82 sec and Fourier transformed after application of a 10 Hz exponential filter. The external reference resonance represents a small capillary positioned between the lobes of the liver, containing $C_6D_6$ plus chromium acetyl acetonate as a relaxation (and shift) agent. b) Single transformed free induction decay (0.20 sec accumulation) of the same liver as in (a) four seconds after a bolus injection of 0.2 ml $D_2O$ into the superior mesenteric vein. A 10 Hz exponential filter was applied prior to Fourier transformation.

Deuterium is a stable, nonradiative isotope of hydrogen and their respective relative natural abundances have been established as 99.9844% hydrogen and 0.0156% deuterium. Deuterium is most commonly and commercially available in the form of heavy water ($D_2O$) which is used as a neutron moderator in the nuclear power industry. It is a quadrupole nuclide (spin=1) with only 0.01 the NMR sensitivity of the proton. Nevertheless, in accordance with the present invention, it is found that the combination of an efficient quadrupole relaxation mechanism and the commercial availability of $D_2O$, essentially 100% enriched to ca. 110 molar equivalent deuterium, provides substantial nuclear magnetic resonance signal-to-noise in the intact subject mammal and renders $D_2O$ (and by inference other deuterated compounds) suitable for in vivo use to obtain deuterium magnetic resonance images and/or spectra of body organs and/or tissues. Moreover, because deuterium is a stable nonradiative isotope, it offers major procedural advantages in imaging use in comparison to radiolabeled materials. For example, a nearby cyclotron facility is not required, nor are special laboratory facilities and radioactive substance handling procedures.

Deuterium has a receptivity comparable to other nuclides observed in vivo. For example, deuterium has 0.61 the receptivity of $-C$, 0.15 that of $^{31}P$ and 0.10 that of $^{23}Na$. In addition, its quadrupole moment provides an efficient relaxation mechanism and the resulting short spin lattice relaxation time produces a large gain in sensitivity per unit time when signal averaging is employed. Thus, for example, in muscle tissue, $T_1$ for $D_2O$ has been reported to be 0.1 sec, and this provides a significant sensitivity enhancement compared with spin ½ nuclides such as $^{31}P$ where $T_1$ relaxation times are often on the order of a second or more. Furthermore, data from my laboratory indicates that the deuterium linewidth in vivo is relatively narrow, e.g. in the liver at 8.5 tesla, an approximately 25 Hz $D_2O$ and 15 Hz [1-D] glucose linewidth has been observed.

For the purpose of obtaining direct observable useful deuterium magnetic resonance images in accordance with the present invention, it is preferable to utilize deuterium in the form of the readily available and relatively inexpensive $D_2O$ or the partially protonated HOD. However, the invention may also be conveniently carried out (both imaging and spectroscopy) utilizing deuterium in the form of other deuterium labeled compounds such as deuterated glucose, glucose analogs, acetate, alanine, pyruvate, lactate and other metabolic substrates and precursors as well as more metabolically inert deuterium labeled blood flow tracers. Such deuterated or deuterium labeled compounds may be selected, for example, on the basis of their molecular site, cell site, or organ specificity where deuterium images of selected organs or tissues are desired. An important advantage of deuterium labeling in contrast to $^{19}F$ labeling, is that deuterium does not greatly perturb chemical reactivity when incorporated into compounds as a label (i.e., substitution of $^2H$ for $^1H$).

Furthermore, $D_2O$ appears to be relatively nontoxic except at very high chronic levels; for example see the following: J.J. Katz. H.L. Crespi, D.M. Czajka and A.J. Finkel, *Am. J. Physiol.*, 203, 907 (1962); H.G. Barbour, *Yale J. Biol. Med.*, 9, 551 (1937); A.M. Hughes and M. Calvin, *Science*, 127, 1445 (1958); A.M. Hughes, E.L. Bennett and M. Calvin, *Proc. Natl. Acad. Sci. USA*, 45, 581 (1959); A.M. Hughes, E.L. Bennett and M. Calvin, *Ann. N.Y. Acad. Sci.*, 84, 763 (1960); D.M. Czajka and A.J. Finkel, *Ann. N.Y. Acad. Sci.*, 84, 770 (1960); D.M. Czajka, A.J. Finkel, C.S. Fisher and J.J. Katz, *Am. J. Physiol.*, 201, 357 (1961); A.P. Amarose and D.M. Czajka, *Exp. Cell. Res.*, 26, 43 (1962).

Accordingly as described in the studies set forth hereafter, deuterium has potential for clinical use in the study of regional blood flow. In this light, it is noted that attaining acute tissue water enrichment to ca. 1–5% $D_2O$ is not expected to be unreasonable in a clinical setting and would provide sufficient sensitivity for deuterium NMR spin-imaging as described in Example 2. For example, $^{23}Na$ images have been successively obtained by others [S.K. Hilal, A.A. Maudsley, J.B. Ra, H.E. Simon, P. Roschmann, S. Sittekoek, Z.N. Cho and S.K. Mun, *J. Comput. Assist. Tomog.*, 9, 1 (1985); D.A. Feinberg, L.A. Crooks, L. Kaufman, M.B. Zawadjki, J.P. Posin, M. Arakawa, J.C. Watts and J.H. Hoenniger, *Radiol.*, 1956, 133 (1985); P.A. Turski, L.W. Houston, W.H. Perman, C.M.S. Trother, C.E. Hayes, G. Glover and F.W. Wehrli, *Radiol.*, 1954 (P), 1966 (1984)] and assuming 100% NMR visibility a 1% $D_2O$ labeling of tissue water (1.1 M deuterium) should result in roughly twice the NMR signal intensity as naturally abundant tissue $^{23}Na$ (66% ×10 mM intracellular, 33% ×140 mM extracellular). Although $D_2O$ imaging would likely exhibit less signal-to-noise and spatial resolution than the conventional $H_2O$ spin-image, it may provide a marked improvement in contrast-to-noise. An analogous comparison might be made between positron emission tomography (PET) and computerized axial tomography (CAT). This is because of the sensitivity of deuterium quadrupole relaxation to structural and dynamic changes in molecular environment and because protocols such as those used in PET can be used to maximize flow modulation of image intensity.

In carrying out the present invention, the commercially available magnetic resonance imaging apparatus may be used with the following modifications.

The RF transmitter section of the imager must be capable of broadcasting at the deuterium resonance frequency; likewise, the RF receiver section (including antenna and preamplification stages) must be capable of detection of deuterium magnetic resonance. In principle, the transmitter-receiver sections can be designed for broad band (multi-frequency) operations. Thus, all nuclides of interest would be accessible with minimal changes in spectrometer configurations.

My preliminary studies suggest that, in contrast to $H_2O$, $D_2O$ exhibits considerably shorter $T_1$ relaxation times. Thus, shorter pulse sequence repetition times (TR) can be used to advantage in deuterium imaging. Because the magnetogyric ratio of deuterium is about one-sixth that of the proton, it will probably be necessary to run imaging systems at upper levels of RF power output and gradient strength. The lower resonance frequency of deuterium relative to protons will reduce RF penetration artifacts in the deuterium image.

Other requirements for a deuterium imaging apparatus are similar to those of current generation proton imagers.

In the practice of the invention, $D_2O$ or other deuterium labeled compound may be administered via numerous routes, for example, but not limited to intraarterially, intravenously, intraperitoneally, or orally. When $D_2O$ is orally ingester preparatory to obtaining deuterium magnetic resonance images, this method of administration is not expected to provide marked organ specificity compared to, for example, intraarterial injection.

The following examples illustrate the practice of the invention.

EXAMPLE 1

Regional Blood Flow Measured by Deuterium Magnetic Resonance Using Deuterated Water as an Inert Diffusible Tracer.

Male Sprague-Dawley rats were fasted for 18 hours, weighed (ca. 225 g) and anesthetized with Halothane (5% for induction, 1% for maintenance). Animals remained under anesthesia throughout the entire experimental protocol and were sacrificed at its conclusion. In lieu of MRI focusing, surgical procedures were employed to access the liver. A four cm transverse, subcostal incision was made in the abdomen. The xiphoid process was removed and the falciform ligament was cut. An infusion catheter was secured in the superior mesenteric vein and kept patent with heparinized saline (0.9% NaCl) at 0.013 cc/min. The abdomen was wrapped in plastic wrap to prevent moisture loss and the animal was secured in the cradle of the NMR probe. (Body temperature was maintained at 37° C. by warm air circulation.) The probe was then brought to the vertical position and the surface coil antenna placed on a 1 mm thick glass plate positioned over the liver. The probe cap was slid over the cradle, the antenna tuned and the probe placed inside the magnet in a vertical position.

The surface-coil antenna was a coaxial double coil arrangement similar to that described previously for in vivo $^{13}C$-[$^1H$] experiments [N.V. Reo, C.S. Ewy, B.A. Siegfried and J.J.H. Ackerman, J. Magn. Reson., 58, 76 (1984)]. An outer 2 cm diameter coil tuned to 360 MHz was used to observe $^1H$ (i.e., $H_2O$) for optimization of the static field (8.5 tesla) homogeneity while the smaller inner 1 cm diameter coil was used for deuterium observation at 55 MHz.

Figure 1B:
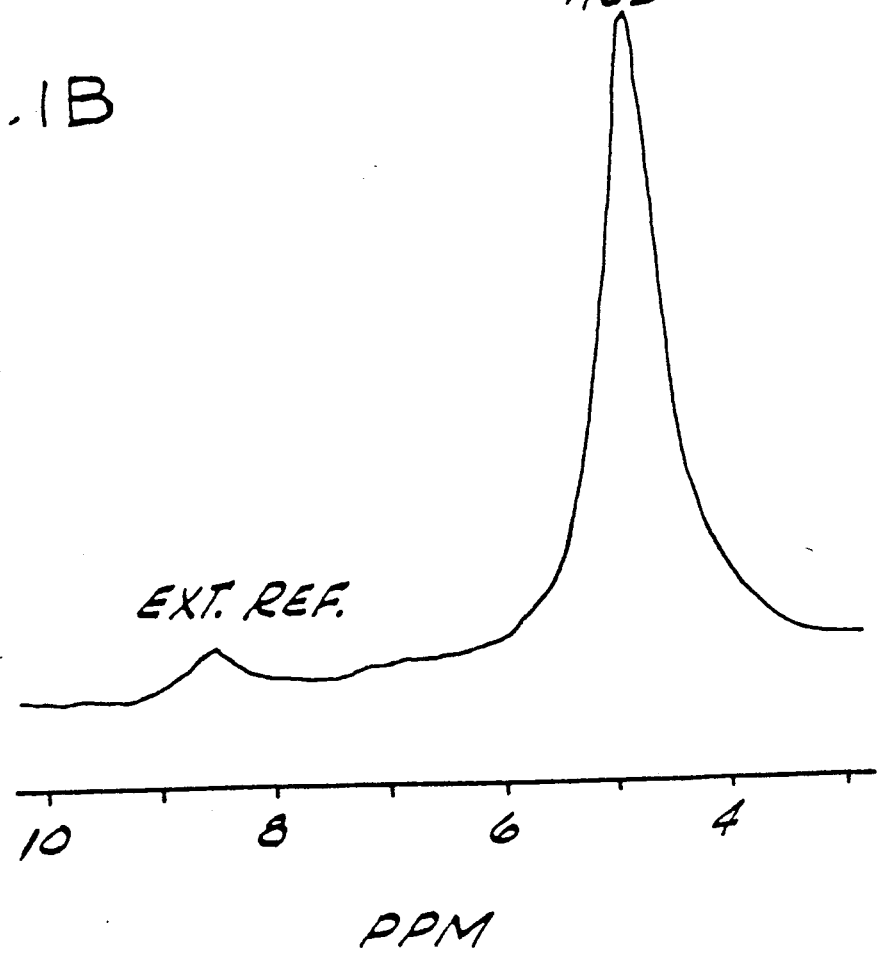

A spin-lattice relaxation time, $T_1$, measurement on the naturally abundant deuterium present in hepatic tissue water (HOD) was performed using surface coil methodology [J.L. Evelhoch and J.J.H. Ackerman, *J. Magn. Reson.*, 53, 52 (1983)]. Nonlinear least squares analysis in terms of a three parameter single exponential magnetization recovery time course gave a time constant $T_1 = 0.25$ sec. This relatively short $T_1$ allows for rapid signal-to-noise enhancement through pulsed Fourier transform time averaging techniques. For example, as shown in FIG. 1, the natural abundance background deuterium signal from rat liver in vivo can readily be observed with high signal-to-noise when 160 scans are summed (time averaged) over 82 sec (FIG. 1a); likewise, an intense hepatic deuterium signal can easily be observed with only one scan a few second after bolus injection of 0.2 ml $D_2O$ into the superior mesenteric vein (FIG. 1b). The superior mesenteric vein leads directly into the portal vein through which ca. 70% of the hepatic blood supply passes. Clearly adequate signal-to-noise and time resolution exist with the model system to demonstrate the measurement of blood flow in the intact subject using $D_2O$ as an inert diffusible tracer.

Figure 2:
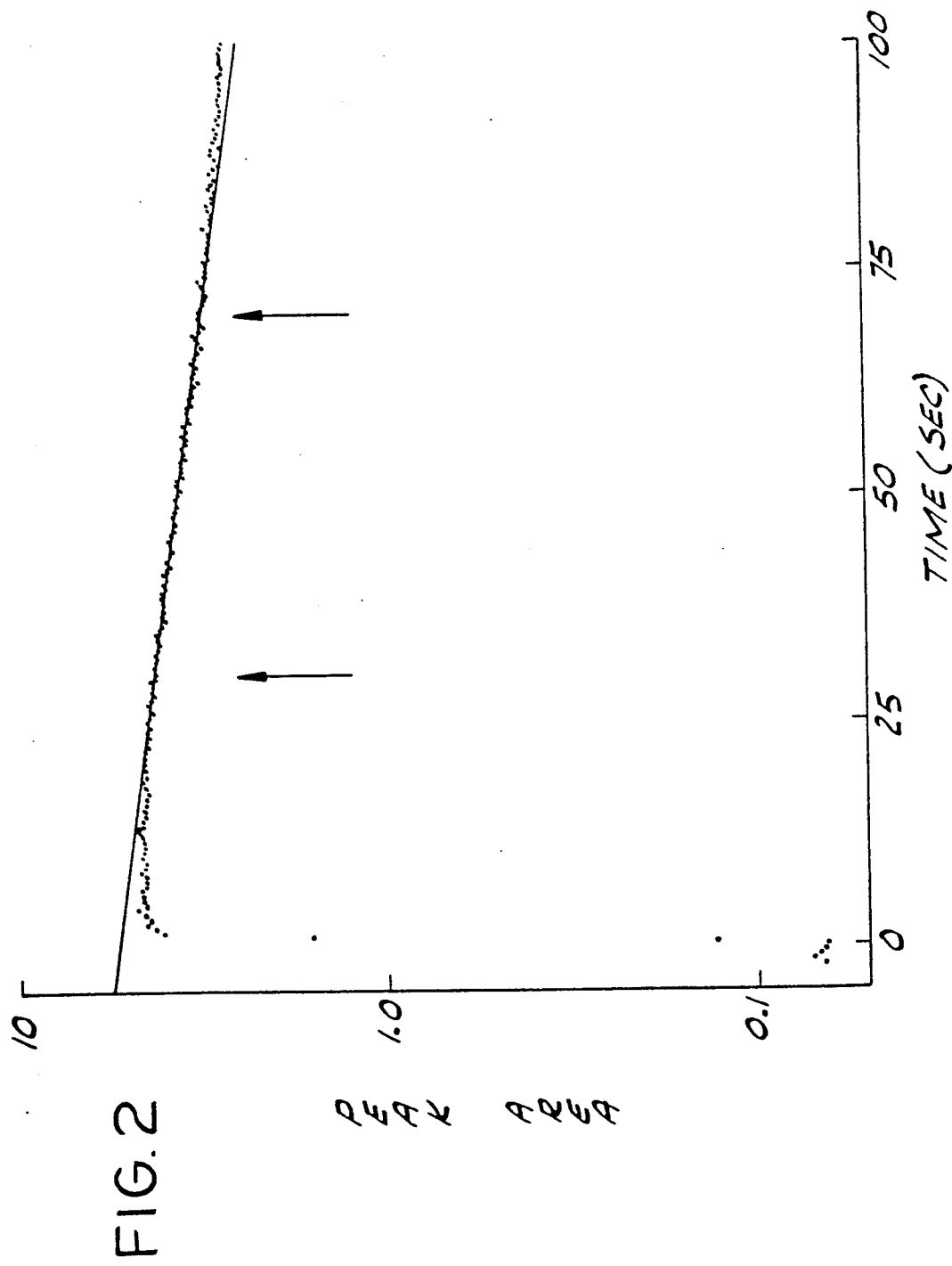
FIG. 2 is a semilogarithmic plot of the hepatic deuterium integrated resonance intensity time course following a bolus injection of 0.2 ml $D_2O$ into the superior mesenteric vein of a fasted (18 hour) anesthetized Sprague-Dawley rat. The symbol, represents experimental points while the solid line represents the result of a nonlinear least squares fit of the data between 30 and 70 sec (arrows) to a three parameter single exponential of the form: $y = A + Be^{-t/T}$. T is the exponential time constant governing the rate of blood-flow washout of the deuterium label from the liver tissue. For the data shown in FIG. 2, T is found to be 2.09 min; this leads to a calculated hepatic blood flow (via Eq. 1 hereinafter) of the 40 ml/100 g/min. The five control period baseline data points taken prior to $D_2O$ administration represent 160 scans per point scaled appropriately (i.e., resonance integrated area were divided by 160) to correspond to single scan data points. This improved signal-to-noise for these low intensity points by ca. 13 fold. The leveling off of the signal intensity time course curve at late time points results from recirculation of deuterium label back into the liver. This represents a breakdown at later time points in one of the assumptions (negligible label recirculation) of the blood flow measurement model employed here.

Following standard blood-flow measurement protocols, the time evolution of the $D_2O$ NMR integrated signal intensity for rat liver in vivo was followed with ca. 0.51 sec time resolution after bolus injection of 0.2 ml of $D_2O$ into the superior mesenteric vein (FIG. 2). The fasted male Sprague-Dawley rats used in this procedure were under anesthesia at all times (1% Halothane) and were sacrificed at the conclusion of the experiment.

Immediately following bolus administration, there is a very rapid marked increase in the deuterium integrated resonance intensity as the tracer enters the liver vascular space and diffuses into the tissues. Concomitant rapid proton exchange yield HOD. This is followed by a slow exponential decrease in signal (note the logarithmic ordinate in FIG. 2) indicative of hepatic deuterium washout by ongoing blood flow. No marked overshoot is integrated signal intensity prior to washout was observed confirming that hepatic blood flow is slow enough to ensure accurate approximation of $D_2O$ as a freely diffusible tracer. Given the natural abundance of deuterium (0.0156%) and the wet and dry weights of the rat liver (8.50 and 2.45 gm respectively), The natural abundance deuterium NMR signal can be shown to represent a total hepatic deuterium content of 0.21 mg and, thus, if necessary, can be used as a convenient internal reference to convert integrated signal intensity to deuterium content. The deuterium content of the premeasurement control-reference state could have been markedly increased in a quantitative manner by an earlier administration of $D_2O$ that was given sufficient time to fully equilibrate throughout the subject. This would provide a much more intense reference signal.

The particular model employed in this blood flow demonstration assumes one compartment with vascular and extravascular spaced in rapid equilibrium, a bolus tracer input (i.e., a pseudo delta function), homogeneous tissue vascularization with no intracompartment tracer concentration gradients, and negligible recirculation of labeled material; within the validity of these assumptions an exponential decay of tissue tracer concentration is expected. The tracer washout exponential time constant (T) can be related to blood flow per unit volume (or mass) of tissue through the central volume principle of tracer kinetics. This leads to an expression for hepatic blood flow (HBF) in units of ml/100 g/min as given by Eq. [1], $$HBF = (\lambda)(100)/T, \quad [1]$$

where $\lambda$ is the mean equilibrium liver-blood partition coefficient of water. The means equilibrium liver-blood partition coefficient of water is the ratio of the water volume of a unit mass of liver tissue (including vascular spaces) to the water volume of a unit volume of blood. Such water content is readily determined from the wet and dry weights of liver and blood and the density of blood, 1.06 g/ml. For rat liver, $\lambda$ was determined to be $0.831 \pm 0.006$ SD ml/g (n=3). Exponential fitting of the deuterium blood flow data of FIG. 2 results in T=2.09 min and using $\lambda=0.831$ gives a value of hepatic blood flow=40 ml/100g/min. This compares satisfactorily with previous hepatic blood flow measurement in the fasted rat, HBF=$80\pm35$ SD ml/100 g/min (n=17) [S.H. Steiner and G.C.E. Mueller, Circ. Res., 9, 99 (1961); fasted (18 hours) Sprague-Dawley rats were examined by the isotope fractionation technique using intraveneously injected $^{86}$RbCl].

EXAMPLE 2

Deuterium Nuclear Magnetic Resonance Spin-Imaging Employing Deuterated Water as the Imaging Medium.

A. Deuterium Imaging of a "Phantom" Test Sample

Figure 3:
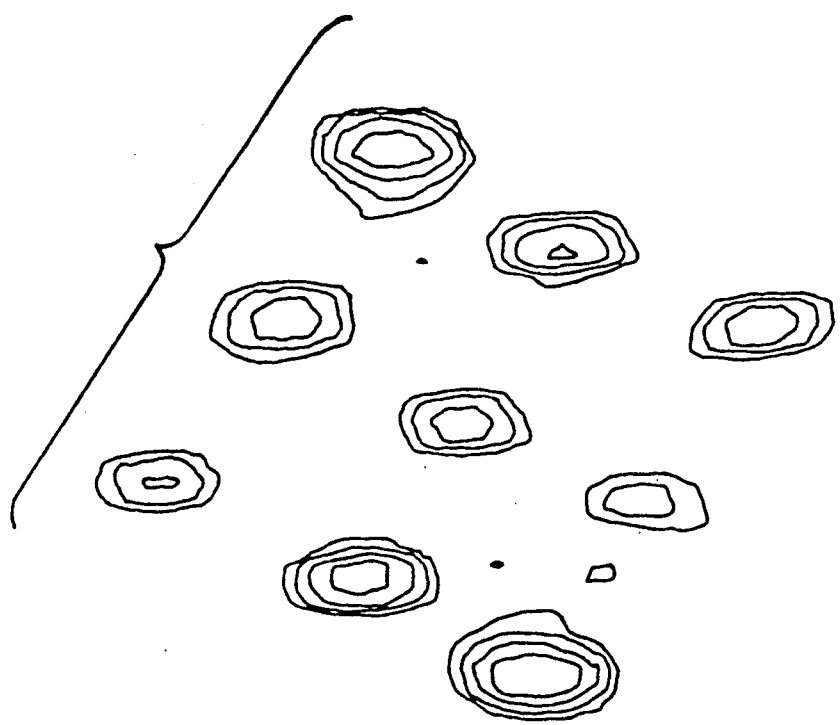
FIG. 3 is a cross sectional deuterium magnetic resonance spin image of a "phantom" test sample composed of a square (1 cm × 1 cm) matrix of $D_2O$ filled capillary tubes (3 × 3) each of 1.5 mm I.D. Image time was approximately two minutes; two dimensional Fourier transform imaging techniques were employed. The static field strength was 4.25 tesla. The nine capillary tubes were clearly visible.

A "Phantom" Test Sample consisting of a square matrix (1 cm×1 cm) of 1.5 mm ID capillary tubes (3×3) filled with $D_2O$ was placed in the 13 cm bore of a 4.25 tesla imaging magnet with a deuterium resonance frequency of 27.8 MHz. An RF coil tuned for the deuterium resonance frequency was placed around the sample. Deuterium Magnetic resonance images were obtained using two dimensional Fourier transform techniques. Imaged slices through the phantom cleanly resolved all nine tubes (FIG. 3).

B. Deuterium Imaging of a Perfused Rabbit Hear

A ca. 4 kg New Zealand white rabbit was anesthetized, its heart rapidly excised, and the aorta cannulated for retrograde perfusion via the coronary arteries. The electrical and contractile functions of the heart were arrested by perfusion with saturated potassium chloride. Arrangements were made such that the hear could then be switched between $H_2O$ or $D_2O$ based perfusion medium (oxygenated physiological salt solution). The perfusion chamber (with heart) was placed into the magnet described above and deuterium magnetic resonance cross sectional images of the heart were obtained. The $D_2O$ filled chambers (right and left ventricles) were clearly seen in the images as regions of high intensity against a less intense background and outline of myocardium tissue.

C. Deuterium Images Obtained During $H_2O$ Washout of the Deuterated Perfusion Media The perfusate was then switched to the $H_2O$ based medium (deuterium NMR silent) and the washout of the imaging medium (deuterated water) was observed. Regions of well perfused rapid flow (i.e., the myocardium) disappeared rapidly from the image while regions of relatively static water (i.e., pools of deuterated water in the left and right ventricles of the arrested heart) were slowly reduced in image intensity. Thus, regions of high flow were distinguishable from those of low flow.

D. Deuterium Images in the Presence of Regional Global Ischemia

The NMR probe and the perfused heat were removed from the magnet. The heart was taken out of the perfusion chamber and the left circumflex artery litigated. The heart was then placed back in the perfusion chamber of the probe and the probe placed back in the magnet. During this entire procedure the heart was perfused (as described previously) with $H_2O$ based perfusion media.

Once the magnet, deuterium magnetic resonance imaging was initiated and $D_2O$ based perfusion started again. As before, the cross sectional images revealed a clean outline and background of myocardium. However, the entire tissue region near the left ventricle (that would normally have been perfused via the left circumflex artery) was clearly missing from the image of the heart. Thus, the region of global ischemia was distinguishable from the regions of normal (well perfused) myocardium.

E. Deuterium Image of Rat Brain

While under anesthesia, a ca. 250 gram male Sprague-Dawley rat was given a series of interperitoneal injections of $D_2O$ (0.9% NaCl) spaced ca. 30–45 minutes apart. A total $D_2O$ volume of 24 ml was administered. The animal was sacrificed with an overdose of anesthesia and placed in an NMR probe. An RF coil was placed about the rat's head and tuned to the deuterium resonance frequency, 27.8 MHz. The probe and animal were then placed into the same magnet as employed previously for the perfused heat images.

A cross sectional deuterium image was obtained of the rat's head. This revealed not only the outline of the brain inside the cranial cavity but also (because of the slice position and its substantial thickness) the eyes of the rat as well. Thus, deuterium imaging of a partially deuterated subject was demonstrated.

F. Deuterium Chemical Shift NMR Spectroscopy of In Vivo Metabolites

Figure 4:
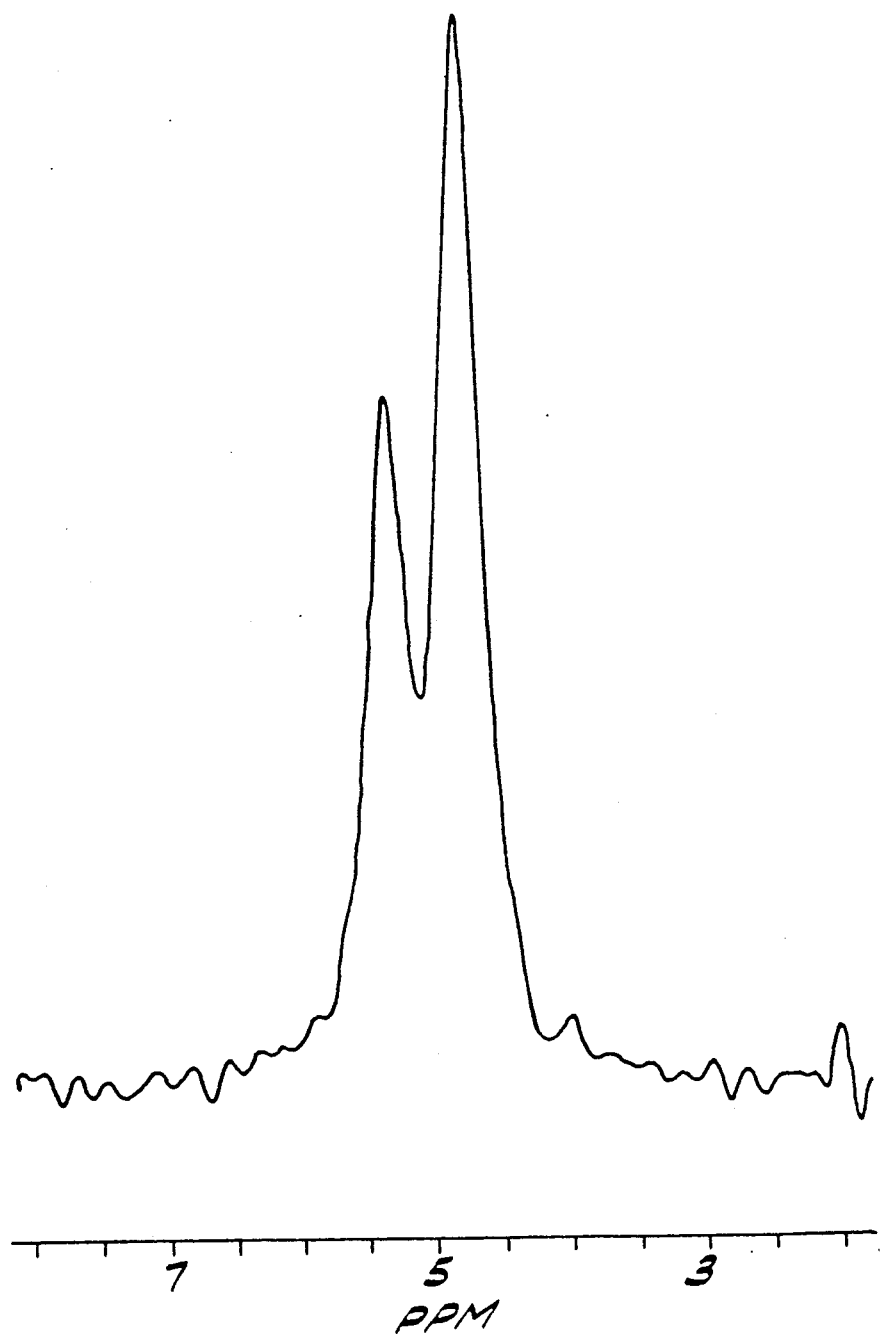
FIG. 4 is a rat hepatic deuterium spectrum, in vivo, post duodenal injection of 235 mg D-glucose-1-$d_1$. The natural abundance deuterated water signal has been subtracted out. Data consists of a 5 minute accumulation, 2500 transients, 0.1 second acquisition time. No exponential filter was applied prior to Fourier transformation.

Using a rat surgical protocol similar to that described in Example 1, an intraduodenal bolus of 235 mg of glucose deuterated at the C-1 position was administered, and the presence of hepatic deuterated metabolites monitored by surface coil NMR as described previously. Soon after injection, intense resonance due to separate α, β anomer D-1 chemical shifts of the labeled hepatic glucose were observed without the need for traditional "water suppression" techniques (see FIG. 4). This demonstrated the use of deuterium labeled compounds to detect important metabolites (and substrates) in vivo by deuterium magnetic resonance.

In view of the above, it will be seen that the several objects of the invention are achieved and other advantageous results attained.

As various changed could be made in the above methods without departing from the scope of the invention, it is intended that all matter contained in the above description or shown in the accompanying drawings shall be interpreted as illustrative and not in a limiting sense.

What is claimed is:

1. A method for obtaining direct, observable deuterium magnetic resonance images of body organs or tissues in vivo and in situ which comprises administering to a mammal deuterium in a sufficient amount to provide direct, observable deuterium magnetic resonance images of said body organs or tissues and utilizing magnetic resonance imaging techniques to obtain direct, observable deuterium magnetic resonance images of body organs or tissues of said mammal in vivo and in situ.

2. A method as set forth in claim 1 wherein deuterium is administered in the form of a deuterated or deuterium labeled compound or compounds.

3. A method as set forth in claim 2 wherein said deuterium labeled compound is $D_2O$, HOD or a mixture of both.

4. A method as set forth in claim 2 wherein said deuterium labeled compound is glucose deuterated at the C-1 position.

5. A method as set forth in claim 1 wherein deuterium magnetic resonance images of blood flow and tissue perfusion are obtained.

6. A method as set forth in claim 1 wherein deuterium magnetic resonance images of the brain and heart are obtained.

* * * * *